(12) United States Patent
Kuo et al.

(10) Patent No.: US 7,603,656 B2
(45) Date of Patent: Oct. 13, 2009

(54) METHODS AND SYSTEMS FOR MODELING CONCURRENT BEHAVIOR

(75) Inventors: Yea Zong Kuo, Rockwall, TX (US); Jerry W. Yancey, Greenville, TX (US)

(73) Assignee: L-3 Communications Integrated Systems L.P., Greenville, TX (US)

( * ) Notice: Subject to any disclaimer, the term of this patent is extended or adjusted under 35 U.S.C. 154(b) by 1182 days.

(21) Appl. No.: 11/036,896

(22) Filed: Jan. 14, 2005

(65) Prior Publication Data

US 2006/0161882 A1 Jul. 20, 2006

(51) Int. Cl.
*G06F 9/44* (2006.01)
(52) U.S. Cl. .................................................... 717/108
(58) Field of Classification Search ................. 719/319, 719/310; 703/7, 9, 20; 717/101–113; 345/619–629; 716/3, 8, 18; 709/203
See application file for complete search history.

(56) References Cited

U.S. PATENT DOCUMENTS 6,286,130 B1 9/2001 Poulsen et al.

FOREIGN PATENT DOCUMENTS

EP 1284454 A2 8/2002

OTHER PUBLICATIONS

McUmber et al, "UML-Based Analysis of Embedded Systems Using a Mapping to VHDL", 1999, 4th IEEE International Symposium of High-Assurance Systems Engineering pp. 1-8.*

Carr et al, "Integration of UML and VHDL-AMS for analogue system modeling", 2004, Formal Aspects of Computing, 16:80-94, pp. 80-94.*

"What Is Object-Oriented Programming (a definition)", http://iroi.seu.edu.cn/books/ee_dic/whatis/opp.htm; Printed from Internet Jul. 29, 2004; 2 pgs., Anonymous.

"What Is An Object (a definition)", http://iroi.seu.edu.cn/books/ee_dic/whatis/object.htm; Printed from Internet Jul. 29, 2004; 1 pg., Anonymous.

"What Is A Class (a definition)", http://iroi.seu.edu.cn/books/ee_dic/whatis/class.htm; Printed from Internet Jul. 29, 2004; 1 pg., Anonymous.

"What Is A Method (a definition)", http://iroi.seu.edu.cn/books/ee_dic/whatis/method.htm; Printed from Internet Jul. 29, 2004; 1 pg., Anonymous.

"What Is A Variable (a definition)", http://iroi.seu.edu.cn/books/ee_dic/whatis/variable.htm; Printed from Internet Jul. 29, 2004; 1 pg., Anonymous.

"What Is Data Modeling (a definition)", http://iroi.seu.edu.cn/books/ee_dic/whatis/datamode.htm; Printed from Internet Jul. 29, 2004; 1 pg., Anonymous.

"What Is UML (Unified Modeling Language) (a definition)", http://iroi.seu.edu.cn/books/ee_dic/whatis/uml.htm; Printed from Internet Jul. 29, 2004; 2 pgs., Anonymous.

(Continued)

*Primary Examiner*—Tuan Anh Vu
(74) *Attorney, Agent, or Firm*—O'Keefe, Egan, Peterman & Enders LLP

(57) ABSTRACT

Methods and systems for modeling concurrent behavior in a sequential programming environment using sequential-execution languages to describe and model multiple different processes which are running simultaneously.

26 Claims, 6 Drawing Sheets

OTHER PUBLICATIONS

Loughman, "Rational Rose: Creating Use-Case And Class Diagrams", Version 1.0, Oct. 19, 2000, 21 pgs.

Matzko et al., "Reveal: A Tool To Reverse Engineer Class Diagrams", 2002, 9 pgs.

"1.3 Concepts of VHDL", http://www.vhdl-online.de/~vhdl/tutorial/englisch/ct_11.htm, Printed from Internet Sep. 16, 2004, 1 pg., Anonymous.

Dictionary Of Programming Languages, http://dgibin.erols.com/ziring/cgi-bin/cep/cep.pl?_key=Visual+Basic, Printed from Internet Jul. 28, 2004, 3 pgs., Anonymous.

Dictionary Of Programming Languages, http://cgi-bin.erols.com/ziring/cgi-bin/cep/cep.pl?_key=VHDL, Printed from Internet Jul. 28, 2004, 3 pgs., Anonymous.

TechWeb: The Business Technology Network, http://www.techweb.com/encyclopedia/defineterm?term=RTL, Printed from Internet Jul. 28, 2004, 3 pgs., Anonymous.

TechWeb: The Business Technology Network, http://www.techweb.com/encyclopedia/defineterm?term=Verilog, Printed from Internet Jul. 28, 2004, 4 pgs., Anonymous.

TechWeb: The Business Technology Network, http://www.techweb.com/encyclopedia/defineter?term=vhdl, Printed from Internet Jul. 28, 2004, 4 pgs., Anonymous.

"ModelSim Code Coverage", Datasheet, Mentor Graphics, www.mentor.com, Printed from Internet Jul. 28, 2004, 3 pgs., Anonymous.

ModelSim Products & Solutions, http://www.model.com/products/default.asp, Printed from Internet Jul. 28, 2004, 3 pgs., Anonymous.

EEdesign, "VHDL-200x Improves Design And Verification Productivity", http://www.eedesign.com/features/exclusive/OEF20031106S0043, Printed from Internet Jul. 28, 2004, 13 pgs., Anonymous.

"ModelSim SE", http://www.model.com/products/se.asp, Printed from Internet Jul. 28, 2004, 3 pgs., Anonymous.

"ModelSim PE", http://www.model.com/products/pe.asp, Printed from Internet Jul. 28, 2004, 2 pgs., Anonymous.

"ModelSim PE", datasheet, Mentor Graphics, www.mentor.com, Printed from Internet Jul. 28, 2004, 2 pgs., Anonymous.

ModelSim, Comparison Of ModelSim PE, LE and SE Products, Printed from Internet Jul. 28, 2004, 1 pg., Anonymous.

"ModelSim SE", datasheet, Mentor Graphics, www.mentor.com, Printed from Internet Jul. 28, 2004, 3 pgs., Anonymous.

"Scalable Verification", datasheet, Mentor Graphics, www.mentor.com/fv, Printed from Internet Jul. 28, 2004, 4 pgs., Anonymous.

"ModelSim Performance And User Interface Key To Success of Siemens Mixed-Language ASIC", Mentor Graphics, www.mentor.com, Printed from Internet Jul. 28, 2004, 2 pgs., Anonymous.

"Switching To Model Technology's Tool Enables Oxford Semiconductor To Reduce Simulation Time Dramatically", Mentor Graphics, www.mentor.com, Printed from Internet Jul. 28, 2004, 2 pgs., Anonymous.

"ModelSim Enables Rapid Prototyping Of VeriWave Wireless LAN Test Equipment", Mentor Graphics, www.mentor.com, Printed from Internet Jul. 28, 2004, 2 pgs., Anonymous.

"Infineon Technologies Trusts ModelSim Mixed-Language Simulation To Create Next-Gen Chip", Mentor Graphics, www.mentor.com, Printed from Internet Jul. 28, 2004, 4 pgs., Anonymous.

"ModelSim 5.8 Quick Guide", Mentor Graphics, www.mentor.com, Printed from Internet Jul. 28, 2004, 2 pgs., Anonymous.

"ModelSim Languages", http://www.model.com/products/languages.asp, Printed from Internet Jul. 28, 2004, 2 pgs., Anonymous.

"ModelSim Compute Farms", http://www.model.com/products/compute_farms.asp, Printed from Internet Jul. 28, 2004, 2 pgs., Anonymous.

"ModelSim Testbenches", http://www.model.com/products/testbenches.asp, Printed from Internet Jul. 28, 2004, 1 pg., Anonymous.

"ModelSim Performance", http://www.model.com/products/performance.asp, Printed from Internet Jul. 28, 2004, 2 pgs., Anonymous.

"ModelSim Assetions/PSL", http://www.model.com/products/assertions.asp, Printed from Internet Jul. 28, 2004, 2 pgs., Anonymous.

"ModelSim Debug Environment", http://www.model.com/products/debug.asp, Printed from Internet Jul. 28, 2004, 1 pg., Anonymous.

"Mentor Graphics Announces Scalable Verification Platform", Mentor Graphics, http://www.mentor.com/press_releases/oct03/1065803579185.html, Printed from Internet Jul. 28, 2004, 7 pgs., Anonymous.

"ModelSim News", http://www.model.com/news_events/alteraandmentor.asp, Printed from Internet Jul. 28, 2004, 2 pgs., Anonymous.

"ModelSim News", http://www.model.com/news_events/sicanadopts.asp, Printed from Internet Jul. 28, 2004, 2 pgs., Anonymous.

"ModelSim News", http://www.model.com/news_events/xilinxjoinsforces.asp, Printed from Internet Jul. 28, 2004, 2 pgs., Anonymous.

"ModelSim News", http://www.model.com/news_events/pixelfusion.asp, Printed from Internet Jul. 28, 2004, 2 pgs., Anonymous.

"ModelSim News", http://www.model.com/news_events/platformscomputing.asp, Printed from Internet Jul. 28, 2004, 2 pgs., Anonymous.

"ModelSim News", http://www.model.com/news_events/ikos_hardware.asp, Printed from Internet Jul. 28, 2004, 2 pgs., Anonymous.

"ModelSim News", http://www.model.com/news_events/alteranowshipping.asp, Printed from Internet Jul. 28, 2004, 2 pgs., Anonymous.

"ModelSim News", http://www.model.com/news_events/verify_2000.asp, Printed from Internet Jul. 28, 2004, 3 pgs., Anonymous.

"ModelSim News", http://www.model.com/news_events/xilinx_ip.asp, Printed from Internet Jul. 28, 2004, 1 pg., Anonymous.

"ModelSim News", http://www.model.com/news_events/zoo.asp, Printed from Internet Jul. 28, 2004, 1 pgs.

"ModelSim News", http://www.model.com/news_events/vhdl_simulation.asp, Printed from Internet Jul. 28, 2004, 1 pg., Anonymous.

"ModelSim News", http://www.model.com/news_events/newhigher_performance.asp,, Printed from Internet Jul. 28, 2004, 2 pgs., Anonymous.

"ModelSim News", http://www.model.com/news_events/toshiba.asp, Printed from Internet Jul. 28, 2004, 1 pg., Anonymous.

"ModelSim News", http://www.model.com/news_events/actel.asp, Printed from Internet Jul. 28, 2004, 2 pgs., Anonymous.

"ModelSim News", http://www.model.com/news_events/hitachi.asp, Printed from Internet Jul. 28, 2004, 1 pg., Anonymous.

"ModelSim News", http://www.model.com/news_events/lattice.asp, Printed from Internet Jul. 28, 2004, 2 pgs., Anonymous.

"ModelSim News", http://www.model.com/news_events/st.asp, Printed from Internet Jul. 28, 2004, 2 pgs., Anonymous.

"ModelSim News", http://www.model.com/news_events/lsi.asp, Printed from Internet Jul. 28, 2004, 2 pgs., Anonymous.

"ModelSim News", http://www.model.com/news_events/high_performance.asp, Printed from Internet Jul. 28, 2004, 2 pgs., Anonymous.

"ModelSim News", http://www.model.com/news_events/insight.asp, Printed from Internet Jul. 28, 2004, 2 pgs., Anonymous.

"ModelSim News", http://www.model.com/news_events/austria.asp, Printed from Internet Jul. 28, 2004, 2 pgs., Anonymous.

Hiday et al., "Mentor Graphics Improves Simulation Performance And Load Sharing Features With ModelSim 5.7", www.mentor.com, Printed from Internet Jul. 28, 2004, 4 pgs.

Hiday et al., "ModelSim From Mentor Graphics First EDA Product To Support Intel's Ground-Breaking 64-bit Itanium 2 Processor On Linux Systems", www.mentor.com, Printed from Internet Jul. 28, 2004, 3 pgs.

"The Mathworks And Mentor Graphics Announce Link For ModelSim", The MathWorks-Press Room, http://www.mathworks.com/company/pressroom/articles/article6575.html, Printed from Internet Jul. 28, 2004, 2 pgs., Anonymous.

Brophy, "EDA Must Extend Standards Further", Electronics News, http://www.reed-electronics.com/electronicnews/article/CA408265, Printed from Internet Jul. 28, 2004, 3 pgs.

Feinberg, "Leading EDA Vendors Announce Support For Altera's Stratix II Device Family", http://www10.edacafe.com/nbc/articles/view_article.php?section=CorpNews$articleid=10 . . . , Printed form Internet Jul. 28, 2004, 2 pgs.

Smith, "The Mathworks And Mentor Graphics Win EDN Innovation Of The Year Award For Link For ModelSim", http://www10.edacafe.com/nbc/articles/view_article.php?section=CorpNews$articleid=11 . . . , Printed from Internet Jul. 28, 2004, 2 pgs.

"ModelSim News", http://www.model.com/news_events/mgcmemeber_ieee-sa.asp, Printed from Internet Jul. 28, 2004, 2 pgs., Anonymous.

"ModelSim Enables Rapid Verification Of Starkey Laboratories Hearing Instrument Designs", www.mentor.com, Printed from Internet Jul. 28, 2004, 3 pgs., Anonymous.

Goering, "EDA Vendors Reveal Plans For System Verilog", EEDesign, http://www.eedesign.com/news/showArticle.jhtml?articleId=21402313, Printed from Internet Jul. 28, 2004, 4 pgs.

Lu et al., "A Case Study Of Hardware And Software Synthesis In ForSyDe", ISSS, Oct. 2-4, 2002, pp. 86-91.

Vahid et al., "SpecCharts: A VHDL Front-End For Embedded Systems", IEEE Transactions On Computer-Aided Design Of Integrated Circuits And Systems, No. 6, Jun. 14, 1995, 13 pgs.

Search Report, PCT/US2005/047633, Sep. 19, 2006, 4 pgs.

* cited by examiner

METHODS AND SYSTEMS FOR MODELING CONCURRENT BEHAVIOR

BACKGROUND OF THE INVENTION

1. Field of the Invention

This invention relates generally to behavior modeling, and more particularly to modeling concurrent behavior in a sequential programming environment.

2. Description of the Related Art

Hardware description languages (HDLs) are used to simulate or model electronic circuits and systems. Examples of HDLs include Very High Speed Integrated Circuit (VHSIC) Hardware Description Language (VHDL) and VERILOG. HDLs are concurrent in nature, meaning that multiple operations occur in parallel at the same time. Because HDLs are based on the principle of concurrence, they are capable of describing and modeling many different processes which are running simultaneously. For example, a RTL language may be used to model or simulate a system or circuit by utilizing a hierarchy that includes multiple entities (Boolean equations, registers, control logic, complex event sequences) corresponding to various parts of the modeled circuit or system. During simulation, these multiple entities operate in parallel in a timed manner that may be adjusted by the user to simulate the system or circuit.

In the past, VHDL language simulations have been implemented using relatively expensive UNIX-based Application Specific Integrated Circuit (ASIC) tools. These bit and clock cycle-accurate UNIX-based simulations are typically lengthy and time consuming to run. PC-based simulators have been developed that utilize a graphical user interface (GUI) and offer VHDL and Verilog language simulation capabilities. However, such PC-based simulators are typically large programs that consume large amounts of memory to function. They also require expensive licenses to operate.

SUMMARY OF THE INVENTION

Disclosed are methods and systems for modeling the concurrent behavior of synchronous digital designs in a sequential programming environment using ordinary sequential-execution languages (i.e., languages which execute one instruction at a time) to describe and model multiple different processes which are running simultaneously. The disclosed methods and systems may be implemented, for example, to facilitate simulation of VHDL and other HDLs using sequential-execution languages such as Visual Basic, Visual C/C++ and C/C++. The disclosed methods and systems may be advantageously implemented in one embodiment to map concurrent-execution HDL programs to object-oriented sequential-execution programs such as Visual Basic, e.g., to allow bit and cycle-accurate HDL (e.g., VHDL) simulations to be run in user-friendly programming environments such as Visual Basic or using other object-oriented programming languages, and in a manner that allows clock-to-clock prediction of the logic state of concurrent HDL programs. In other embodiments, the disclosed methods and systems may be implemented to map concurrent execution languages other than object-oriented programming languages (e.g., non-HDL programming languages) to any type of sequential-execution language.

In one embodiment, the disclosed methods and systems may be implemented to provide a PC-based simulation program that operates in sequential-execution language and that correlates to the logical behavior of a concurrent-execution HDL simulation program on a clock-by-clock basis. In this regard, a code development tool may be provided that may be utilized to run and simulate concurrent-execution programs or source code (e.g., prior to loading on ASIC hardware) using a sequential-execution language that may be executed, for example, in a PC environment or with any other type of computer system employing sequentially executing processor/s. For example, a programmable submodule of an ASIC device in the form of a programmable state machine (PSM) may be designed in VHDL, and a PC-based code development simulation tool may be provided to allow PSM programs for an ASIC to be created, run and simulated relatively quickly and easily in a PC environment, without the need for lengthy and time-consuming VHDL simulations with relatively expensive simulator tools. In one exemplary embodiment, using a GUI interface, the PC-based simulation tool may advantageously be used to create software for ASIC by programmers with no knowledge of VHDL or UNIX-based simulation tools, and the methodology of the simulation tool may be configured to so that the PC-based simulation correlates exactly to the behavior of the original VHDL.

In one exemplary embodiment, parallel VHDL assignments may be mapped to a sequential execution language using a structure that allows the mapped assignments of the sequential code to run in the same manner that they are run in the VHDL code, i.e., so that clock-by-clock all the parallel tasks of each sequential step are accomplished before moving to the next step. For example, the modular structure of a VHDL PSM may be mapped onto a Rose diagram that serves as a framework for an object-oriented sequential language program. Objects may then be instantiated in a sequential-code model according to their arrangement and number in the PSM. Specialized VHDL types such as standard logic vectors (bit arrays) and standard logic (single bits) may also be mapped and instantiated. In this manner, the VHDL code may be directly translated line-for-line into object-oriented sequential-execution programs such as Visual Basic that may then be used to successfully model the behavior of the original VHDL code.

The disclosed methods and systems may be advantageously implemented in one exemplary embodiment to provide a PC-based software tool that may be utilized to run simulations of concurrent execution HDL programming for ASIC devices (e.g., Field Programmable Gate Arrays ("FPGAs") or other field programmable devices ("FPDs") or programmable logic devices ("PLDs")) separate from an ASIC hardware device, e.g., prior to loading the programming into the ASIC. For example, a PC-based simulation tool may be provided that is configured to simulate and display operations (e.g., internal states, executing instruction numbers, etc.) of an ASIC programmable state machine without requiring that the HDL state machine programming be actually loaded into the ASIC device. The PC-based tool may be optionally configured with graphical user interface (GUI) capability that is utilized for user input and display of state machine operations.

In one respect, disclosed herein is a method of modeling concurrent execution language, including: providing a concurrent execution language code; mapping elements of the concurrent execution language code onto a hierarchical relationship; and developing a sequential execution language code based at least in part on the hierarchical relationship.

In another respect, disclosed herein is a method of modeling Very High Speed Integrated Circuit Hardware Description Language (VHDL) code, including: providing VHDL code; mapping elements of the VHDL code onto a hierarchical relationship; and developing an object oriented language code based at least in part on the hierarchical relationship.

In another respect, disclosed herein is a code development tool, including software configured to execute on a computer system employing one or more sequentially executing processors, and that is configured to receive elements of a concurrent execution language code via an input interface. The code development tool may be further configured to: map elements of the concurrent execution language code onto a hierarchical relationship; and develop a sequential execution language code based at least in part on the hierarchical relationship.

In another respect, disclosed herein is a system for modeling concurrent execution language, including: a computer system having one or more sequentially executing processors; and a code development tool configured to execute on the computer system, the code development tool being configured to receive elements of a concurrent execution language code via an input interface. The code development tool may be configured to perform the following steps: map elements of the concurrent execution language code onto a hierarchical relationship; and develop a sequential execution language code based at least in part on the hierarchical relationship.

DESCRIPTION OF ILLUSTRATIVE
EMBODIMENTS

Figure 1:
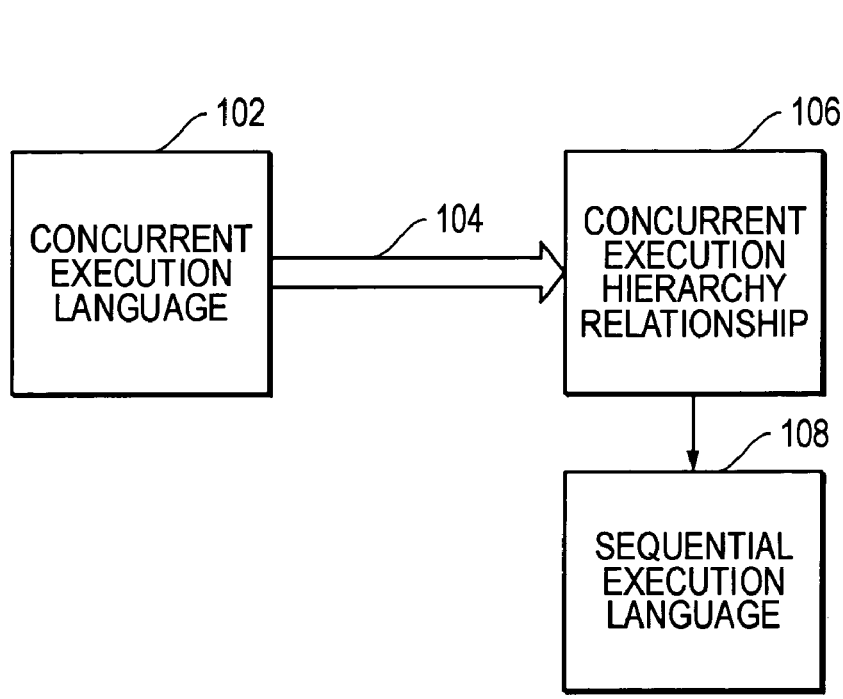
FIG. 1 illustrates development of sequential execution language from concurrent execution language according to one exemplary embodiment of the disclosed methods and systems.

FIG. 1 illustrates one embodiment of the disclosed methods and systems in which sequential execution language 108 may be developed that is suitable for modeling behavior of concurrent execution language 102. It will be understood that the methodology of FIG. 1 may be implemented in any suitable manner to develop sequential language 108, e.g., by manual programming/coding, and/or by a partial or completely automated process that implements the steps of FIG. 1 using any suitable combination of hardware, firmware or software (e.g., microcontroller/microprocessor, firmware and/or software) suitable for implementing the steps of FIG. 1.

In the embodiment of FIG. 1, the hierarchy of concurrent execution language 102 may be mapped in step 104 onto a concurrent execution hierarchy relationship 106 that is a suitable framework for sequential execution language 108. Examples of concurrent execution language 102 include, but are not limited to, HDLs such as VHDL and Verilog, etc. Examples of sequential execution language 108 include, but are not limited to, Visual Basic, Visual C/C++, C, C++, Basic, Java, etc.

Still referring to the embodiment of FIG. 1, concurrent execution language 102 includes multiple operations that occur simultaneously in parallel, and signal assignments are scheduled as the code is run. In contrast, sequential execution language 108 includes operations that are performed one step at a time. To develop sequential execution language 108 that is suitable for modeling the behavior of concurrent execution language 102, the hierarchy of concurrent language execution language 102 may first be mapped in step 104 into a relationship 106 that structures the parallel tasks of concurrent execution language 102 that need to be accomplished in each sequential step (e.g., clock step) of sequential execution language 108 before moving to the next sequential step of sequential language 108. A sequential execution language 108 that is capable of scheduling the operations of concurrent language 102 in the proper order may then be developed from hierarchy 106 as shown.

Figure 2:
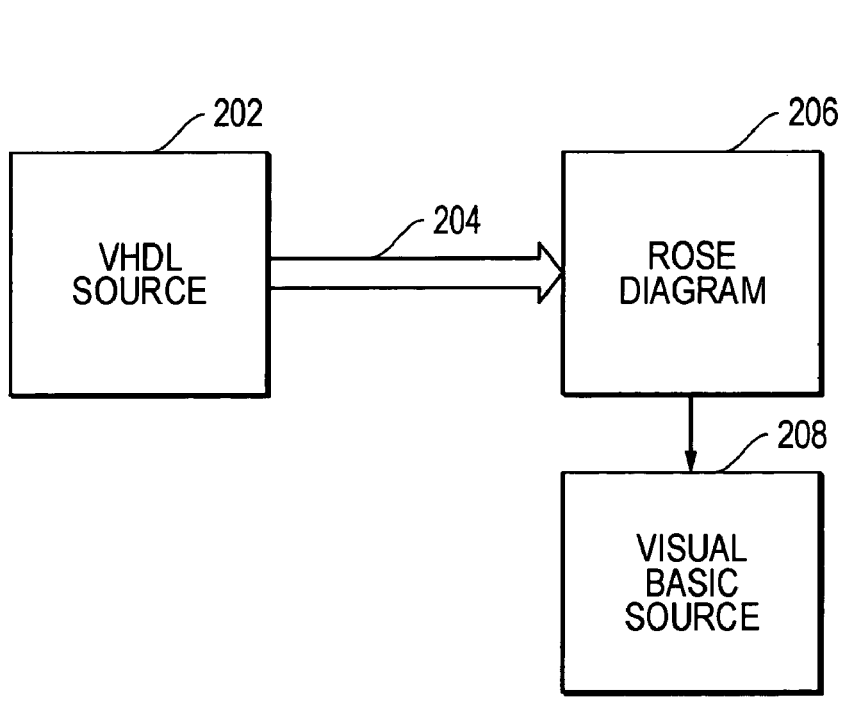
FIG. 2 illustrates development of Visual Basic source code from VHDL source code according to one exemplary embodiment of the disclosed methods and systems.

As an example, FIG. 2 illustrates one exemplary embodiment of the disclosed methods and systems in which Visual Basic source code 208 may be developed that is suitable for modeling behavior of VHDL source code 202. In the embodiment of FIG. 2, the hierarchy of VHDL source code 202 may be mapped in step 204 onto a Rose diagram 206 to form a framework for Visual Basic source code 208. Examples of hierarchical elements of VHDL source code 202 include, but are not limited to, VHDL modules and registers that control the modules.

Figure 3A:
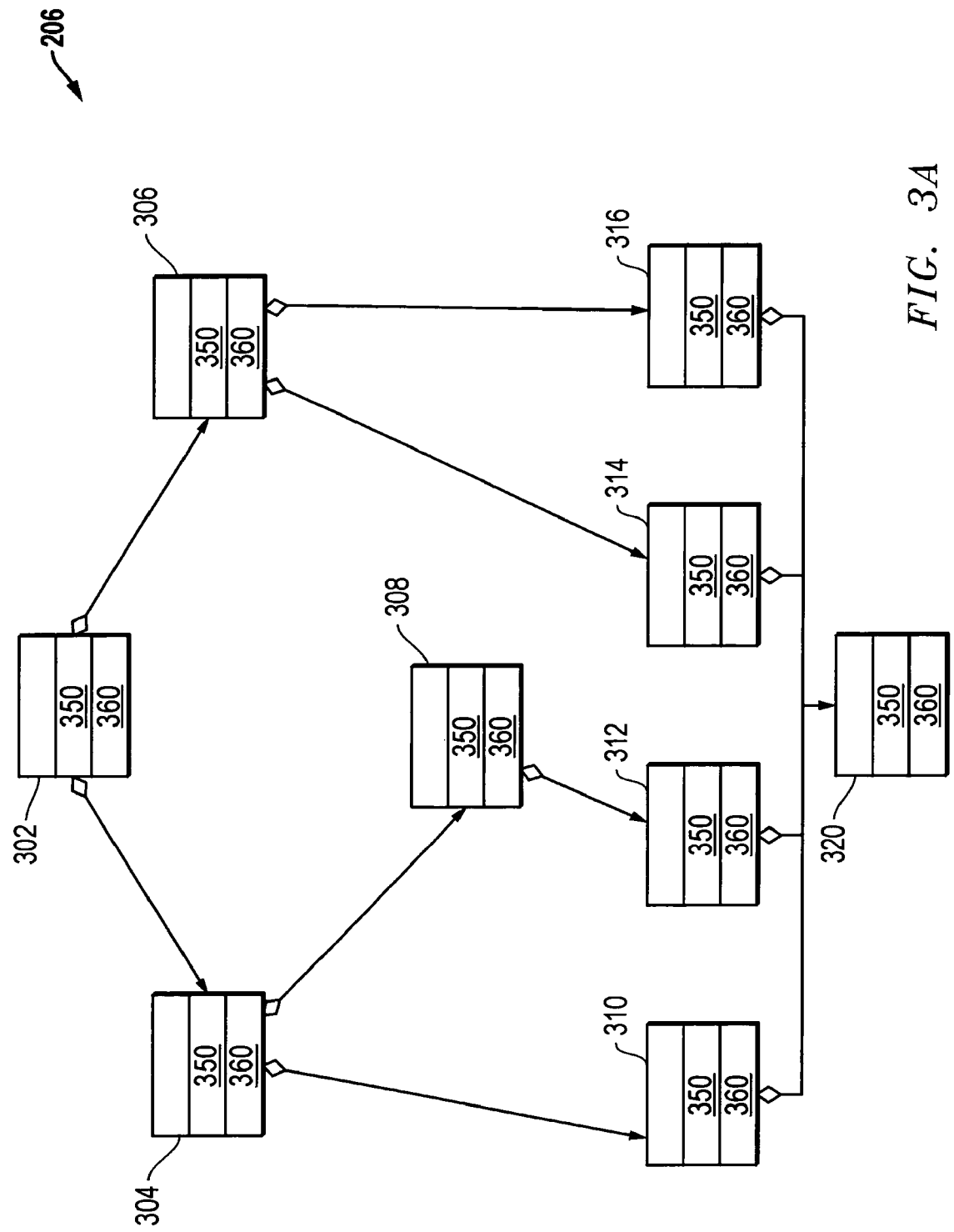
FIG. 3A illustrates a Rose diagram hierarchical relationship according to one exemplary embodiment of the disclosed methods and systems.

FIG. 3A illustrates one exemplary embodiment in which the modular structure of a VHDL PSM source code 202 is mapped onto a Rose diagram 206 via mapping step 204. In this embodiment, Rose diagram 206 is employed to represent the modular hierarchical relationship of VHDL PSM source code 202. As illustrated in FIG. 3A, Rose diagram 206 includes upper level class 302 and mid-level classes 304, 306 and 308. In Rose diagram 206, each class represents a group of multiple objects. Each of the illustrated upper level and mid level classes may be defined in mapping step 204 to represent a hierarchical major module or functional module of VHDL source code 202. Key properties (e.g., records, size of array, size of std logic vector, etc.) of each VHDL module may be represented as objects or attributes 350 of each class, and key functions (e.g., procedures, functions, initialization at reset, initialization at different states, etc.) of each VHDL module may be represented as operations or methods 360 of each class.

Still referring to FIG. 3A, Rose diagram 206 includes lower level classes 310, 312, 314 and 316. In the illustrated embodiment, each of these lower level classes may be defined to represent VHDL registers or processes that control the VHDL modules represented by classes 304, 306 and 308. As shown in FIG. 3A, generic VHDL functions (e.g., registers) may be mapped as one or more superclasses 320 that have characteristics that are inherited by other specialized classes. Module objects may then be instantiated according to their arrangement and number in the VHDL PSM. In one embodiment, specialized VHDL types may be mapped as follows: 1) strings and integers may be used to represent/manipulate the standard logic vector type (bit arrays), and 2) Booleans may be used to represent the standard logic type (bit). In this manner, Rose diagram 206 may be used as a framework for object oriented Visual Basic source code 208.

Figure 3B:
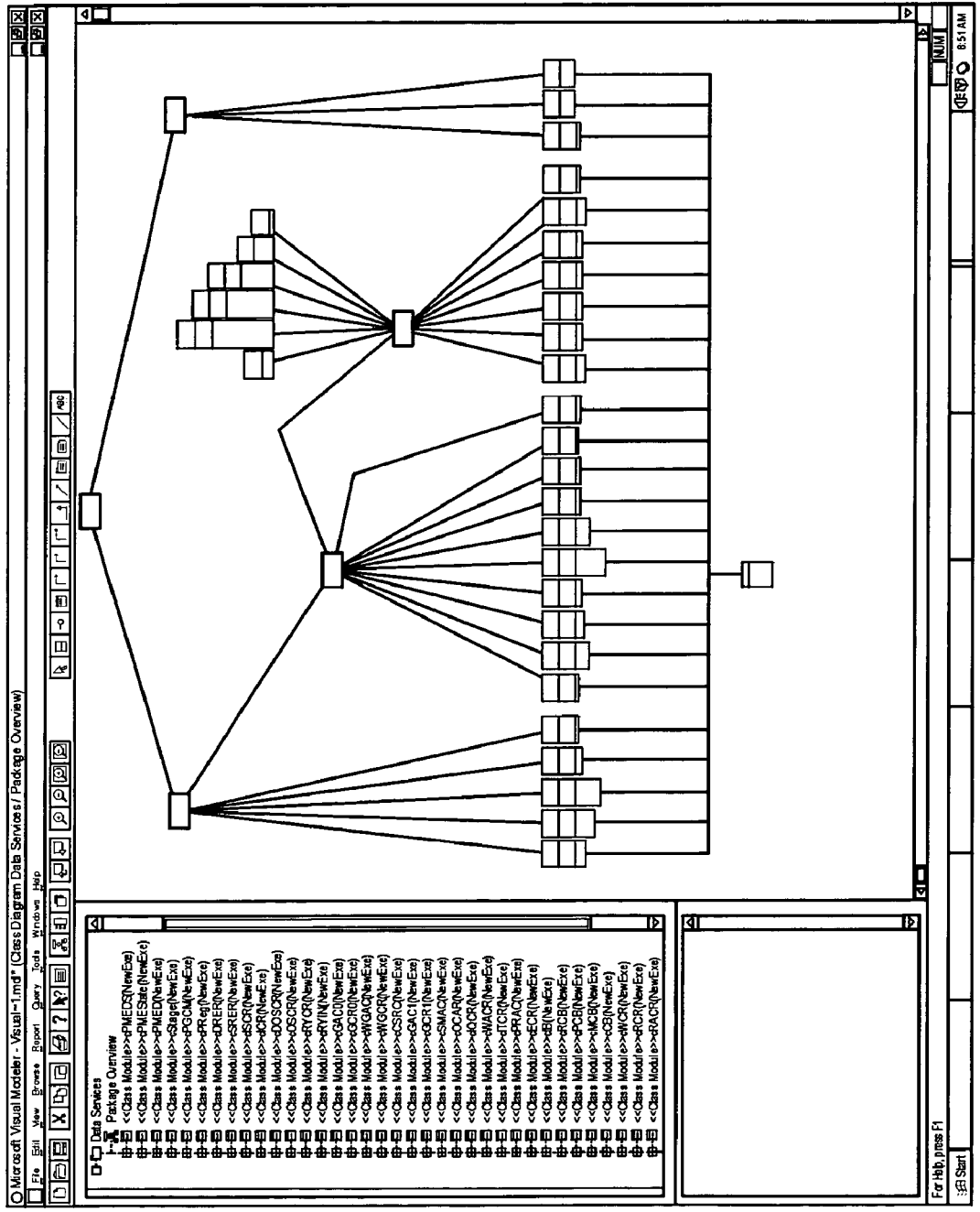
FIG. 3B illustrates a Rose diagram hierarchical relationship according to one exemplary embodiment of the disclosed methods and systems.

In the practice of the disclosed methods and systems, the hierarchy of concurrent language execution language may be mapped into a relationship (e.g., such as Rose diagram 206) using any suitable methodology. For example, FIG. 3B illustrates an exemplary PSM Rose diagram created with Microsoft Visual Modeler.

Referring again to FIG. 2, concurrent behavior of a VHDL PSM model (VHDL source code 202) may be translated into an equivalent Visual Basic syntax (Visual Basic source code 208), rather than requiring re-coding PSM functions from scratch. This allows rapid creation of timing-accurate models for use in a Visual Basic code development tool, and VHDL source code maybe directly translated to Visual Basic code to emulate functions of a VHDL module such as a fir filter, linear combiner, Q-R matrix decomposition, matrix inversion, etc.

Figure 4:
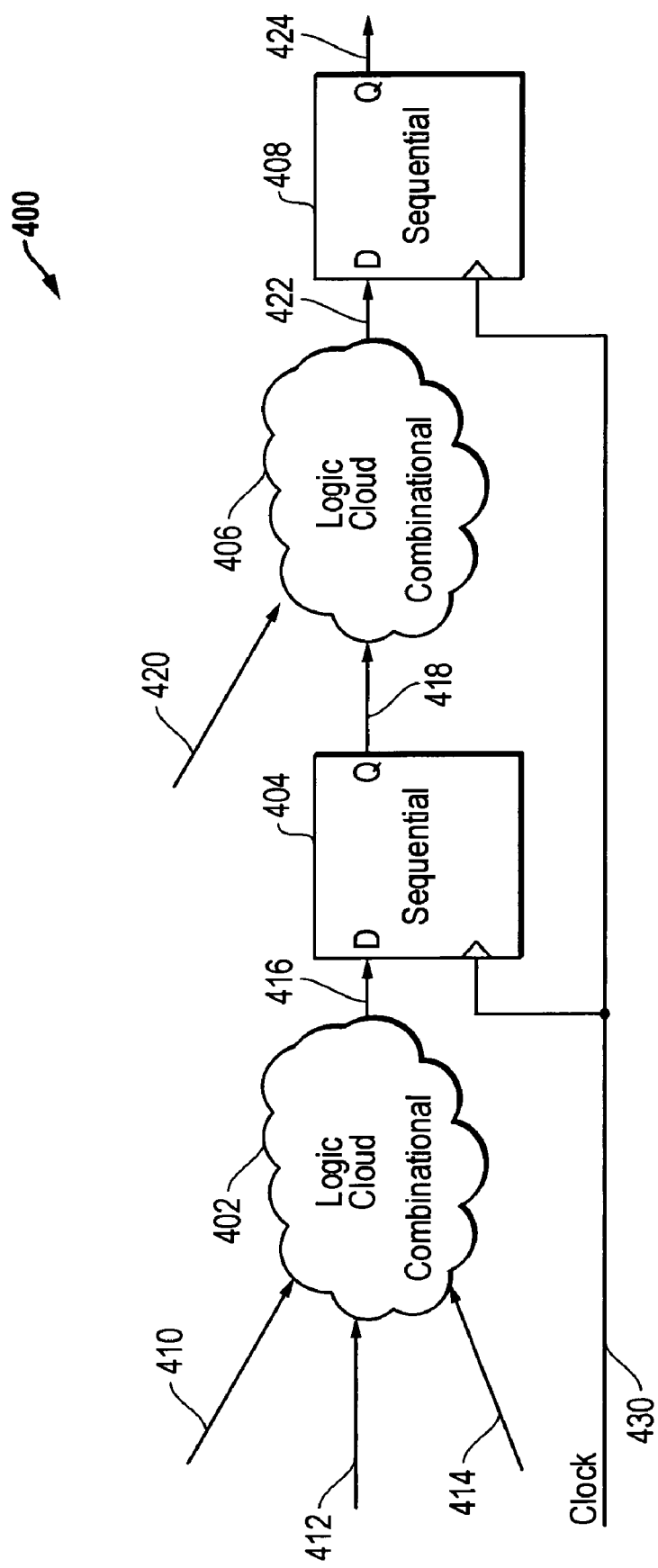
FIG. 4 is a schematic representation of the relationship between concurrent and sequential behavior in a module of VHDL PSM source code according to one embodiment of the disclosed methods and systems

FIG. 4 is a schematic representation of the relationship between concurrent and sequential behavior as may occur in a module 400 of VHDL PSM source code 202. Within VHDL code, it is understood that VHDL assignment operators may take the form of variable assignments (denoted as ":=") and signal assignments (denoted as "<="). Variable assignments take effect immediately, but are only valid within the scope of a single process. Signal assignments are scheduled immediately, but do not take effect until all processes in a VHDL model have been evaluated. In a synchronous design, such processes are typically evaluated on each clock cycle. This may be at the rising edge or falling edge of a clock. This produces the effect of parallel functionality which is used to model hardware designs.

As shown in FIG. 4, a module of VHDL code may be subdivided into multiple units called "processes". In the illustrated exemplary embodiment, module 400 is divided into two combinational processes 402 and 406, and into two sequential processes 404 and 408. Combinational processes 402 and 406 are evaluated when their respective inputs change, i.e., combinational process 402 is evaluated for output 416 when one or more of inputs 410, 412 and/or 414 change, and combinational process 406 is evaluated for output 422 when one or more of inputs 418 or 420 change. Sequential processes are evaluated when some external event occurs, such as the rising edge of a clock signal. In the illustrated embodiment, sequential processes 404 and 408 are evaluated for respective outputs 418 and 424 each cycle of clock signal 430. Although one example of a module having four processes is illustrated and described in relation to FIG. 4, it will be understood that a variety of different combinations of combinational and sequential processes are possible for modules of VHDL source code to model the concurrent nature when more than one process exists.

Figure 5:
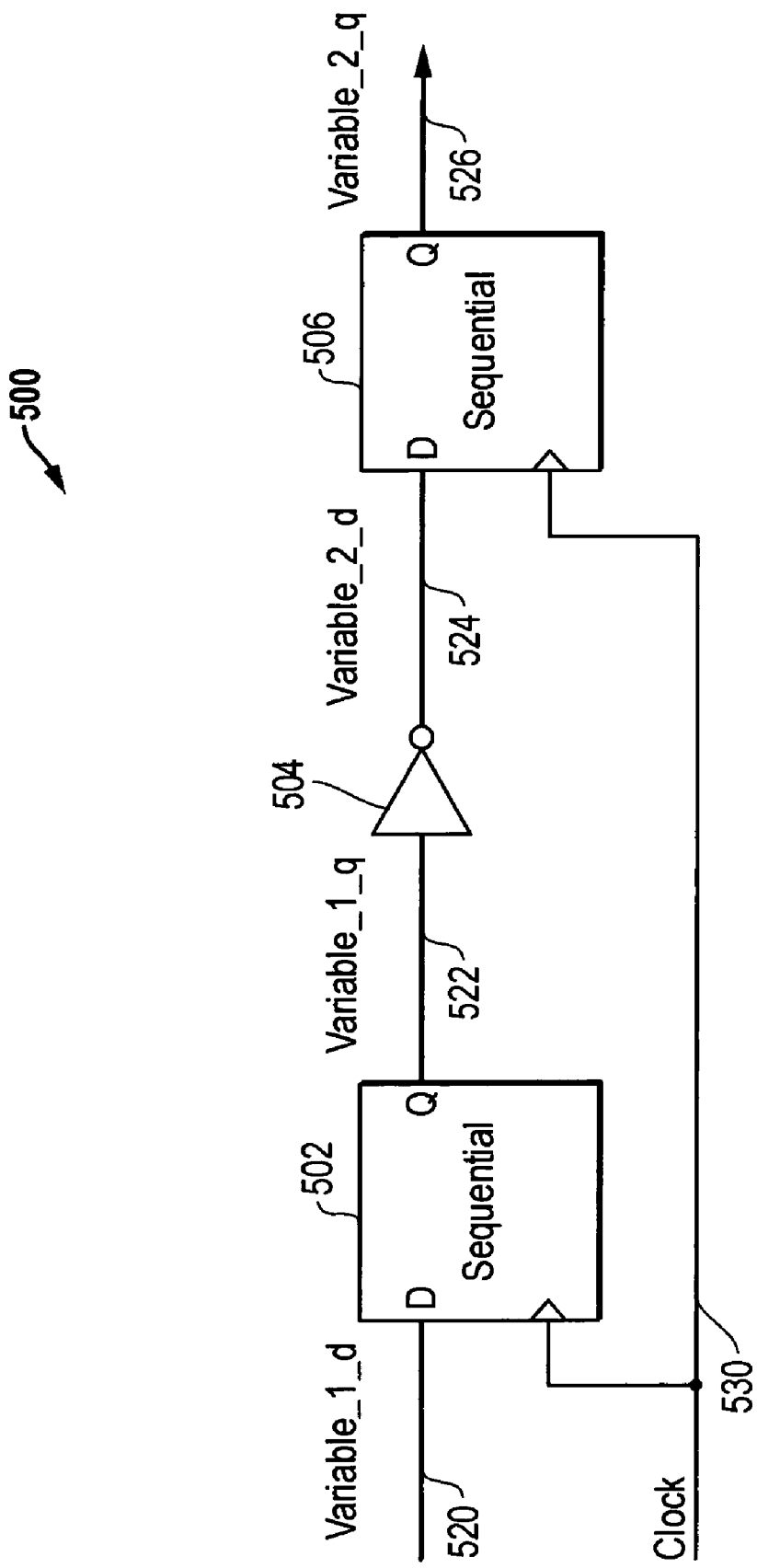
FIG. 5 is a schematic representation of a module Visual Basic code that has been provided to model a corresponding VHDL PSM module according to one embodiment of the disclosed methods and systems.

FIG. 5 is a schematic representation of a module 500 of Visual Basic code that has been provided as a model of a corresponding VHDL PSM module (e.g., in combination with other modeled modules of VHDL PSM code that are not shown) according to one embodiment of the disclosed methods and systems, e.g., after mapping step 204 of FIG. 2. As illustrated in FIG. 5, combinational and sequential assignments are segregated in the Visual Basic module 500. In this regard, modeled VHDL module 500 includes combinational assignment 504 and sequential assignments 502 and 506. The combinational assignment 504 is exemplary of the combinational processes 402 and 406 illustrated in FIG. 4; the sequential assignments 502 and 506 are exemplary of the sequential processes 404 and 408 illustrated in FIG. 4. In such an embodiment, inter-module input/output ("I/O") is restricted to sequential signals only. Also, in this embodiment, sequential assignments use a common clock, distributed using clock signal 530. Although one example of a module having a single clock distributed to all sequential processes is illustrated and described in relation to FIG. 5, it will be understood that a variety of different combinations and uses of synchronous clocks are possible within the described method. In such an embodiment, clock signals are not routed through combinational processes.

In the illustrated exemplary embodiment of FIG. 5, combinational assignment 504 is shown present as an inverter between sequential assignments 502 and 504, although it will be understood that in other embodiments a combinational assignment may take any other suitable form (e.g., Direct assignments, Boolean functions, multiplexers, etc.). In the exemplary embodiment of FIG. 5, Variable_1_q=Variable_1_d for sequential assignment 502; Variable_2_d=Not(Variable_1_q) for combinational assignment 504; and Variable_2_q=Variable_2_d for sequential assignment 506.

Still referring to the exemplary embodiment of FIG. 5, input signal 520 represents external input received by module 500 (e.g., input from another module of Visual Basic source code 208 to the "d" input of a flip-flop 502) and is represented in FIG. 5 as having value "Variable_1_d". Upon receipt of a clock rising edge from clock signal 530, sequential assignment 502 provides signal 522 from the "q" output of the flip-flop 502, providing value "Variable_1_q" to combinational assignment 504. Combinational assignment 504 receives signal 522 and provides signal 524 to the "d" input of the second flip-flop 506 represented in FIG. 5 as having value "Variable_2_d". Upon receipt of the next clock rising edge from clock signal 530, sequential assignment 506 from the "q" output of the second flip-flop 506 provides signal 526 having value "Variable_2_q" as external output from module 500 (e.g., output to another module of Visual Basic source code 208).

To properly realize the parallel behavior of the VHDL model in one embodiment, the sequential Visual Basic program is organized to follow a cyclic execution path; after initialization establishes the initial values of all variables (usually caused by a separate "reset" signal), signal assignments are then made once each "clock," or cycle of the program, followed by the execution of the translated model code itself. In order for the sequential program to mimic the clocked behavior of the VHDL model, signal assignments (when all the "_q" variables are made equal to their corresponding "_d" variables) may all be made in order inside the Visual Basic program (e.g., in a subroutine of the Visual Basic program). Once these assignments are made, the remaining translated code can then be executed sequentially, resulting in accurate modeling of the parallel behavior of the original VHDL model for the next clock cycle. If so desired, signal states can be analyzed and displayed prior to the next clock.

Figure 6:
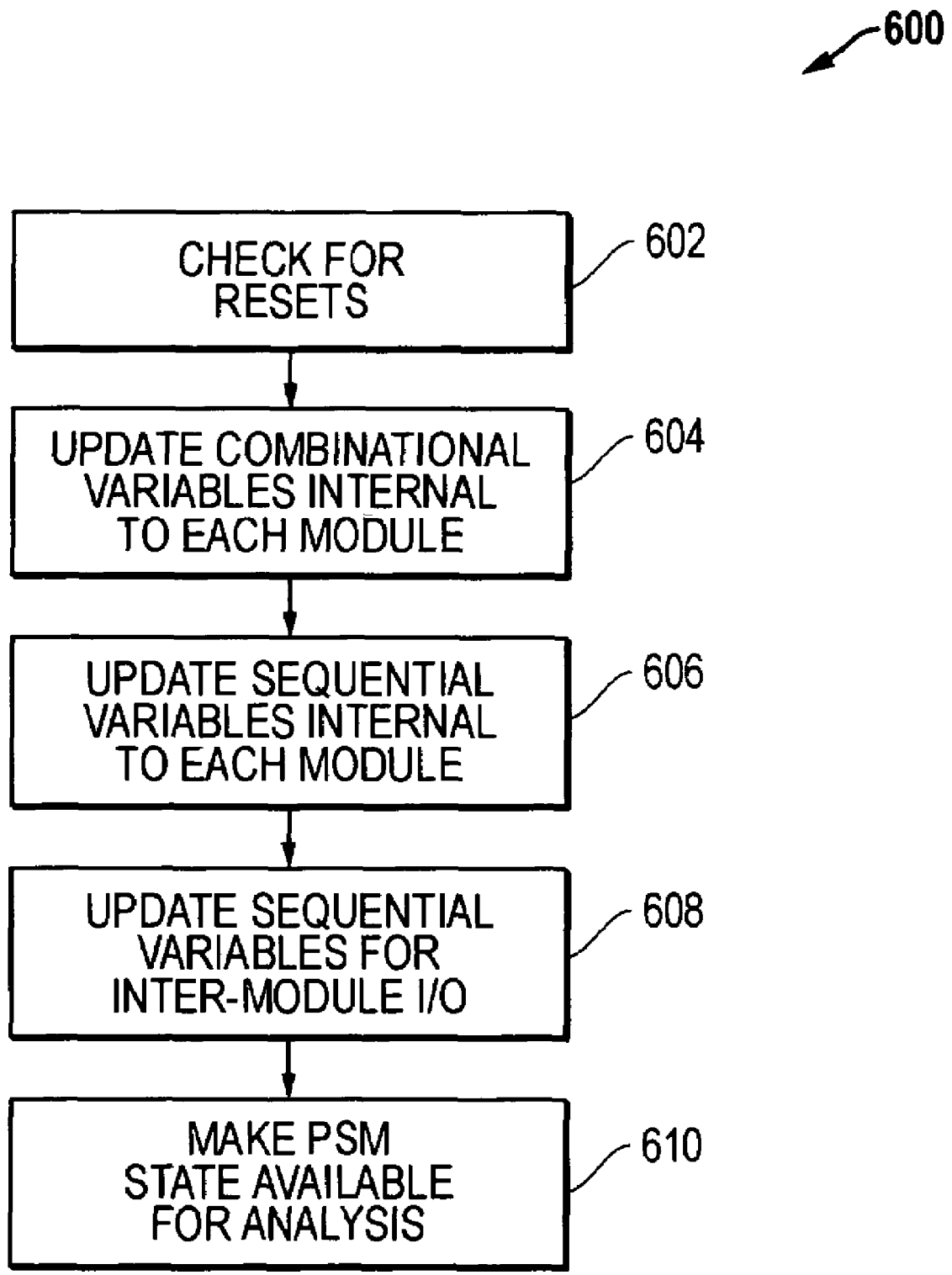
FIG. 6 is a flow diagram illustrating a sequence of tasks according to one embodiment of the disclosed methods and systems.

FIG. 6 is a flow diagram illustrating a sequence of tasks 600 that may be performed each clock cycle for Visual Basic source code 208 according to one exemplary embodiment of the disclosed methods and systems. During each clock cycle, sequence 600 starts by checking for resets in step 602. Combinational variables are then updated internally to each module (e.g., combinational assignment 504 of FIG. 5 is updated) in step 604. Sequential variables are next updated internally to each module (e.g., sequential assignments 502 and 506 of FIG. 5 are updated) in step 606. After finishing internal module updates in steps 604 and 606, sequential variables are updated for inter-module I/O's in step 608. At this time, the PSM state is made available for analysis (e.g., the state of all internal variables, both sequential and combinational) in step 610. Although FIG. 6 illustrates a particular combination and sequence of steps that may be performed in one exemplary embodiment, it will be understood that other combinations and sequences of steps are possible. For example, the disclosed systems and methods may be implemented without all of the steps of FIG. 6. In this regard, not all steps 604, 606 and 606 may be required depending on the nature of the concurrent code (e.g., all combinational, all registered, etc.), and it is possible that the disclosed systems and methods may be implemented with any one of steps 604, 606 and 606, or any combination of two of such steps.

Referring again to the exemplary embodiment of FIG. 2, provided below is an example of VHDL source code 202 prior to conversion to Visual Basic source code 208.

```
if sMODE = "01" - - IF THE RYCR MODE IS 1,
then - - MAKE ASSIGNMENTS FOR "LINKED DATAPIPE SOURCE"
    sRANGE <= sHOST_RANGE;
    sREAD_START(3) <= cRAY_RTL_A_LSB(3);

if (RAY_PME_INPUT.PME_DATA_VLD_N = '0')    - - IF THE RAY HAS A VAL INPUT
    AND                                    - - AND
    NOT(sRAY_DISABLED)                     - - THE RAY IS NOT DISABLED
then                                       - - CHECK FOR ACTIVE WR CYCLE if NOT (sWRITE_ACTIVE)   - - IF A WRITE SEQUENCE IS NOT ACTIVE
then                     - - CHECK FOR ERROR if sREAD_ACTIVE      - - IF A READ SEQUENCE IS STILL ACTIVE
    then                 - - TOGGLE ERR INTERRUPT & DISABLE THE RAY
    RAY_INTR_OUT <= '1';
    sRAY_DISABLED <= TRUE;

else - - START THE SEQUENCES NORMALLY
    sWRITE_ACTIVE <= TRUE;
    sREAD_ACTIVE <= TRUE;
    sREAD_INTERVAL_COUNT <= conv_std_logic_vector
            (1, sREAD_INTERVAL_COUNT'high + 1);
    sREAD_DELAY_COUNT <= sREAD_DELAY;
```

Provided below is an example of Visual Basic source code 208 developed according to the methodology of FIG. 2 that is suitable for modeling behavior of VHDL source code 202 above. Using this methodology, the hierarchy of VHDL source code 202 above was mapped in step 204 onto a Rose diagram 206 to form a framework for Visual Basic source code 208 below. The example of Visual Basic source code below has been annotated to show comments in bolded text, and to show VHDL key words in italicized text

```
' IF THE RYCR MODE IS 1, THEN MAKE ASSIGNMENTS FOR
"LINKED DATAPIPE SOURCE"
If(RYCR(P, S, O). Mode = 1) Then
    mREAD_START_d = O
    ' IF THE RAY HAS A VAL INPUT
    ' AND THE RAY IS NOT DISABLED, THEN CHECK FOR ACTIVE
    WR CYCLE
If mInput_DV And Not (mRAY_DISABLED_q) Then
    ' IF A WRITE SEQUENCE IS NOT ACTIVE, THEN CHECK FOR
    ERROR
    If Not (mWRITE_ACTIVE_q) Then
        ' IF A READ SEQUENCE IS STILL ACTIVE, THEN TOGGLE
        ERR INTERRUPT
        If mREAD_ACTIVE_q Then
            mRAY_INTR_OUT_d = True
            mRAY_DISABLED_d = True
        Else ' START THE SEQUENCES NORMALLY
            mWRITE_ACTIVE_d = True
            mREAD_ACTIVE_d = True
            mREAD_INTERVAL_COUNT_d = 1
            mREAD_DELAY_COUNT_d = RYCR (P, S, O). Read_Delay
        End If ' ERROR CHECK
    End If ' WRITE ACTIVE CHECK
```

Using the above Visual Basic source code 208, the behavior of VHDL source code 202 may be modeled. Advantages of using a sequential execution language (such as Visual Basic source code 208) to model behavior of a concurrent execution language (such as VHDL source code 202) include the ability to use sequential execution language debugging tools to debug the model sequential code. This includes functions which monitor the state of program execution, allow breakpoints to be set (instruction addresses/states which stop program execution to allow evaluation of states), allow memory to be analyzed, allow automatic annotation of program symbols to memory, and allow limited manual code changes outside of the compiler. Furthermore, in one exemplary embodiment, a code development tool may be provided that employs a custom GUI interface or other suitable application interface that allows a user to run, edit and/or program the model sequential code (e.g., Visual Basic source code 208) as if the user were directly running, editing and/or programming the concurrent execution code (e.g., VHDL source code 202). Such a code development tool may be implemented as a PC-based code development tool (e.g., Visual Basic code development tool) that is utilized for user input and display of state machine operation, e.g., the internal states of the state machine and what instruction number it is currently on. In one embodiment, additional benefit may be derived where the concurrent VHDL code is designed to execute in close association with or is controlled by a separate, but related sequential program (e.g., microprocessor control code). In such an embodiment, the behavior of both sets of code may be simulated in the same PC-based clock-accurate GUI environment.

In a further embodiment, the simulation capabilities provided by the disclosed methods and systems may be employed to model or simulate agile FPGA programming code that utilizes elements of real time sequential programming in combination with elements of concurrent execution language, i.e., for use with self-modifying FPGA hardware in which the FPGA configuration changes dynamically as a function progresses. The disclosed methods and systems may be implemented to provide the advantage of being able to model the behavior of dynamically changing VHDL both in cases where the VHDL logic determines the timing of the change as well as when an external sequential program makes the determination.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed methods and systems may be utilized in various combinations and/or independently. Thus the invention is not limited to only those combinations shown herein, but rather may include other combinations.

What is claimed is:

1. A method of modeling concurrent execution language, comprising:
   providing a hardware description language (HDL) code;
   mapping a modular structure of said HDL code onto a hierarchical structure of a Rose diagram type, said hierarchical structure of said Rose diagram type comprising multiple classes, each of said multiple classes representing a group of multiple objects, and one or more of said multiple classes being defined to represent a respective function module of said HDL code; and
   using said hierarchical structure as a framework to develop an object oriented language code;
   wherein at least one function module of said HDL code comprises one or more properties and one or more functions; and wherein one or more objects of at least one of said multiple classes represents said one or more properties of said HDL code function module; and wherein one or more operations of at least one of said multiple classes represents said one or more functions of said HDL code function module.

2. The method of claim 1, wherein said method comprises mapping parallel tasks of said HDL code onto said hierarchical structure; and developing said object oriented language code based at least in part on said hierarchical structure so that said developed object oriented language code comprises parallel tasks corresponding to said parallel tasks of said HDL code, said parallel tasks of said object oriented language code to be executed in a common clock cycle of said object oriented language code before moving to a next clock cycle of said object oriented language code.

3. The method of claim 1, wherein said HDL comprises Very High Speed Integrated Circuit Hardware Description Language (VHDL); and wherein said method comprises mapping parallel assignments of said VHDL code onto said hierarchical structure; and developing said object oriented code based at least in part on said hierarchical structure so that said developed object oriented code comprises parallel tasks corresponding to said parallel tasks of said concurrent execution language VHDL assignments, said parallel tasks of said object oriented code to be executed in a common clock cycle of said object oriented language code before moving to a next clock cycle of said object oriented code.

4. The method of claim 3, wherein said object oriented code comprises Visual Basic or Visual C/C++ code.

5. A method of modeling Very High Speed Integrated Circuit Hardware Description Language (VHDL) code, comprising:
   providing VHDL code;
   mapping a modular structure of said VHDL code onto a hierarchical structure of a Rose diagram type, said hierarchical structure of said Rose diagram type comprising multiple classes, each of said multiple classes representing a group of multiple objects, and one or more of said multiple classes being defined to represent a respective function module of said VHDL code; and
   using said hierarchical structure as a framework to develop an object oriented language code;
   wherein at least one function module of said VHDL code comprises one or more properties and one or more functions; and wherein one or more objects of at least one of said multiple classes represents said one or more properties of said VHDL code function module; and wherein one or more operations of at least one of said multiple classes represents said one or more functions of said VHDL code function module.

6. The method of claim 5, wherein one or more of said multiple classes is defined to represent a respective VHDL register that controls said VHDL function module.

7. The method of claim 6, wherein one or more of said multiple classes is defined as a superclass to represent a respective generic VHDL register.

8. The method of claim 5, comprising using said hierarchical structure as a framework to develop at least one Visual Basic module based on one of said Rose diagram type classes that represents a respective function module of said VHDL code; wherein said Visual Basic module comprises a clock loop, at least two sequential assignments and at least one combinational assignment between said at least two sequential assignments.

9. The method of claim 8, wherein first and second classes of said multiple Rose diagram type classes are defined to represent respective first and second function modules of said VHDL code; wherein said developing comprises developing first and second Visual Basic modules based on said respective first and second Rose diagram type classes; and wherein inter-module input/output (I/O) between said first and second Visual Basic modules is performed by sequential I/O.

10. The method of claim 9, further comprising performing the following steps during each clock cycle:
   a) first updating combinational variables internally to each of said first and second Visual Basic modules;
   b) then updating sequential variables internally to each of said first and second Visual Basic modules; and
   c) then updating sequential variables for said inter-module I/O between said first Visual Basic module and said second Visual Basic module.

11. The method of claim 10, wherein said method further comprises:
   d) making the state of said first and second Visual Basic modules available for analysis after performing said steps a) though c); and
   wherein said steps a) through d) are performed using a computer system employing one or more sequentially executing processors.

12. The method of claim 11, wherein said first and second modules comprise a portion of an ASIC programmable state machine.

13. The method of claim 11, wherein said method further comprises making the state of said first and second Visual Basic modules available for analysis on a graphical user interface (GUI).

14. A code development tool, comprising software configured to execute on a computer system employing one or more sequentially executing processors, and being configured to receive elements of a hardware description language (HDL) code via an input interface; and wherein said code development tool is further configured to:
   map a modular structure of said HDL code onto a hierarchical structure of a Rose diagram type, said hierarchical structure of said Rose diagram type comprising multiple classes, each of said multiple classes representing a group of multiple objects, and one or more of said multiple classes being defined to represent a respective function module of said HDL code; and
   use said hierarchical structure as a framework to develop an object oriented language code;
   wherein at least one function module of said HDL code comprises one or more properties and one or more functions; and wherein one or more objects of at least one of said multiple classes represents said one or more properties of said HDL code function module; and wherein one or more operations of at least one of said multiple classes represents said one or more functions of said HDL code function module.

15. The code development tool of claim 14, wherein said HDL comprises Very High Speed Integrated Circuit Hardware Description Language (VHDL).

16. The code development tool of claim 15, wherein said code development tool is configured to map parallel assignments of said VHDL code onto said hierarchical structure; and to develop said object oriented code so that said developed object oriented code comprises parallel tasks corresponding to said parallel tasks of said concurrent execution language VHDL assignments, said parallel tasks of said object oriented code to be executed in a common clock cycle of said object oriented language code before moving to a next clock cycle of said object oriented code.

17. The code development tool of claim 15, wherein said code development tool is configured to develop a first module of said object oriented code that represent a first function module of said VHDL code; wherein said code development tool is configured to develop a second module of said object oriented code that represent a second function module of said VHDL code; wherein said first and second modules of said object oriented code each comprises a clock loop, at least two sequential assignments and at least one combinational assignment between said at least two sequential assignments; and wherein inter-module input/output (I/O) between said first and second object-oriented code modules is performed by sequential I/O.

18. The code development tool of claim 17, wherein said code development tool is further configured to perform the following steps during each clock cycle:
   a) first updating combinational variables internally to each of said first and second object oriented code modules;
   b) then updating sequential variables internally to each of said first and second object oriented code modules;
   c) then updating sequential variables for said inter-module I/O between said first object oriented code module and said second object oriented code module; and
   d) making the state of said first and second object oriented code modules available for analysis after performing said steps a) through c).

19. The code development tool of claim 18, wherein said method further comprises making the state of said first and second Visual Basic modules available for analysis on a graphical user interface (GUI).

20. The code development tool of claim 14, wherein said input interface comprises a graphical user interface (GUI) interface.

21. The code development tool of claim 14, wherein said code development tool is configured as a PC-based code development tool.

22. A system for modeling concurrent execution language, comprising:
   a computer system having one or more sequentially executing processors; and
   a code development tool configured to execute on said computer system, said code development tool being configured to receive elements of a hardware description language (HDL) code via an input interface, and to perform the following steps:
      map a modular structure of said HDL code onto a hierarchical structure of a Rose diagram type, said hierarchical structure of said Rose diagram type comprising multiple classes, each of said multiple classes representing a group of multiple objects, and one or more of said multiple classes being defined to represent a respective function module of said HDL code; and
      use said hierarchical structure as a framework to develop an object oriented language code;
      wherein at least one function module of said HDL code comprises one or more properties and one or more functions; and wherein one or more objects of at least one of said multiple classes represents said one or more properties of said HDL code function module; and wherein one or more operations of at least one of said multiple classes represents said one or more functions of said HDL code function module.

23. The system of claim 22, wherein said HDL comprises Very High Speed Integrated Circuit Hardware Description Language (VHDL).

24. The system of claim 22, further comprising a graphical user interface (GUI) interface; and wherein said code development tool is configured to receive elements of said HDL code via said GUI.

25. The system of claim 24, wherein said code development tool is further configured to make the state of one or more modules of said object oriented code available for analysis on said GUI.

26. The system of claim 25, wherein said computer system is a PC-based computer system.

* * * * *

UNITED STATES PATENT AND TRADEMARK OFFICE
CERTIFICATE OF CORRECTION

PATENT NO. : 7,603,656 B2
APPLICATION NO. : 11/036896
DATED : October 13, 2009
INVENTOR(S) : Kuo et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1309 days.

Signed and Sealed this

Fifth Day of October, 2010

David J. Kappos
*Director of the United States Patent and Trademark Office*